(12) United States Patent  (10) Patent No.: US 8,736,073 B2
Kunimoto  (45) Date of Patent: May 27, 2014

(54) SEMICONDUCTOR DEVICE

(71) Applicant: Shinko Electric Industries Co., Ltd., Nagano (JP)

(72) Inventor: Yuji Kunimoto, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/891,463

(22) Filed: May 10, 2013

(65) Prior Publication Data

US 2013/0307113 A1   Nov. 21, 2013

(30) Foreign Application Priority Data

May 17, 2012  (JP) ................................. 2012-113837

(51) Int. Cl.
*H01L 23/48*   (2006.01)

(52) U.S. Cl.
USPC ..................... 257/776; 257/778; 257/E23.044

(58) Field of Classification Search
CPC ........... H01L 2224/16151; H01L 2224/16145; H01L 2224/16148
USPC .................. 257/724, 776, 778, 784, E23.044, 257/E23.063; 438/107, 108
See application file for complete search history.

(56) References Cited

U.S. PATENT DOCUMENTS 8,355,262 B2   1/2013  Inoue et al.
8,564,121 B2 *  10/2013  Ihara et al. ................... 257/707

FOREIGN PATENT DOCUMENTS

JP   2008-153492   7/2008

* cited by examiner

*Primary Examiner* — Quoc Hoang
(74) *Attorney, Agent, or Firm* — IPUSA, PLLC

(57) ABSTRACT

A semiconductor device includes a first insulating layer; a wiring layer formed on a first surface of the first insulating layer and including a first electrode pad; a semiconductor chip; a second insulating layer including a semiconductor chip accommodating portion; a third insulating layer on the second insulating layer; and a passive element including an electrode and formed of an embedded portion and a protruding portion on a second surface of the first insulating layer, wherein an end surface of the embedded portion is coated by the insulating layer, the electrode of the passive element is electrically connected to the wiring layer through a via wiring formed in the insulating layers, the first electrode pad is electrically connected to another semiconductor device through a joining portion, and a protruding amount of the protruding portion is less than a gap between the second surface and the another semiconductor device.

11 Claims, 5 Drawing Sheets

SEMICONDUCTOR DEVICE

CROSS-REFERENCE TO RELATED APPLICATIONS

This application is based upon and claims the benefit of priority of the prior Japanese Patent Application No. 2012-113837, filed on May 17, 2012, the entire contents of which are incorporated herein by reference.

FIELD

The embodiments discussed herein are related to a semiconductor device and a manufacturing method of the semiconductor device.

BACKGROUND

There is proposed a semiconductor device having a package on package structure (a so-called POP structure), where a second semiconductor device is laminated on a first semiconductor device, on which a semiconductor chip as an active element and a passive element are mounted. Such a semiconductor device has a structure where the semiconductor chip or the passive element is mounted on a surface of the first semiconductor device or on a surface of the second semiconductor device between the first semiconductor device and the second semiconductor device as disclosed in Japanese Unexamined Patent Application Publication No. 2008-153492.

SUMMARY

According to an aspect of an embodiment, a semiconductor device includes a first insulating layer being an outermost layer of the semiconductor device; a wiring layer that is formed on a first surface of the first insulating layer and includes a first electrode pad; a semiconductor chip having a circuit forming surface positioned on a surface of the semiconductor chip opposite to the first insulating layer; a second insulating layer that is formed on the first surface of the first insulating layer, coats the wiring layer, and includes a semiconductor chip accommodating portion for accommodating the semiconductor chip; a third insulating layer that is arranged on the second insulating layer and coats the circuit forming surface and side surfaces of the semiconductor chip; and a passive element that includes an electrode and is formed of an embedded portion embedded in at least the first insulating layer and a protruding portion protruding from a second surface opposite to the first surface of the first insulating layer, wherein an end surface of the embedded portion is coated by one of the first, second, and third insulating layers, the electrode of the passive element is positioned at an end of the embedded portion and electrically connected to the wiring layer through a via wiring formed in at least the one of the first, second, and third insulating layers coating the end surface of the embedded portion, the first electrode pad is electrically connected to another semiconductor device through a joining portion, and a protruding amount of the protruding portion protruding from the second surface of the first insulating layer is less than a gap between the second surface of the first insulating layer and a surface of the another semiconductor device facing the second surface of the first insulating layer.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

As described previously, the exemplary semiconductor device has a structure where the semiconductor chip or the passive element is mounted on a surface of the first semiconductor device or on a surface of the second semiconductor device between the first semiconductor device and the second semiconductor device.

However, the passive element such as a capacitor has a thickness of, for example, 200 μm. Therefore, in the above structure, a gap between facing surfaces of the first and second semiconductor devices is widened to be, for example, 250 μm. Thus, the total thickness of the semiconductor device having the POP structure becomes great. If the gap between facing surfaces of the first and second semiconductor devices is widened, a solder ball having a great diameter or the like is used to join the first semiconductor device to the second semiconductor device. If the solder ball having the great diameter is used, the radii of electrode pads to be connected with the solder balls are increased to deal with the great diameter. Therefore, the widths of the first semiconductor device and the second semiconductor device are widened. Said differently, the exemplary semiconductor device having the POP structure is hard to be miniaturized.

The semiconductor chip or the passive element may be built in a first semiconductor device so that the semiconductor chip or the passive element is not mounted in the facing surfaces of the first and second semiconductor devices. In this case, the first semiconductor device is thickened. Therefore, it is difficult to miniaturize the semiconductor device having the POP structure.

Preferred embodiments of the present invention will be explained with reference to accompanying drawings. Where the same reference symbols are attached to the same parts, repeated description of the parts is omitted.

First Embodiment (The Structure of a Semiconductor Device of the First Embodiment)

Figure 1:
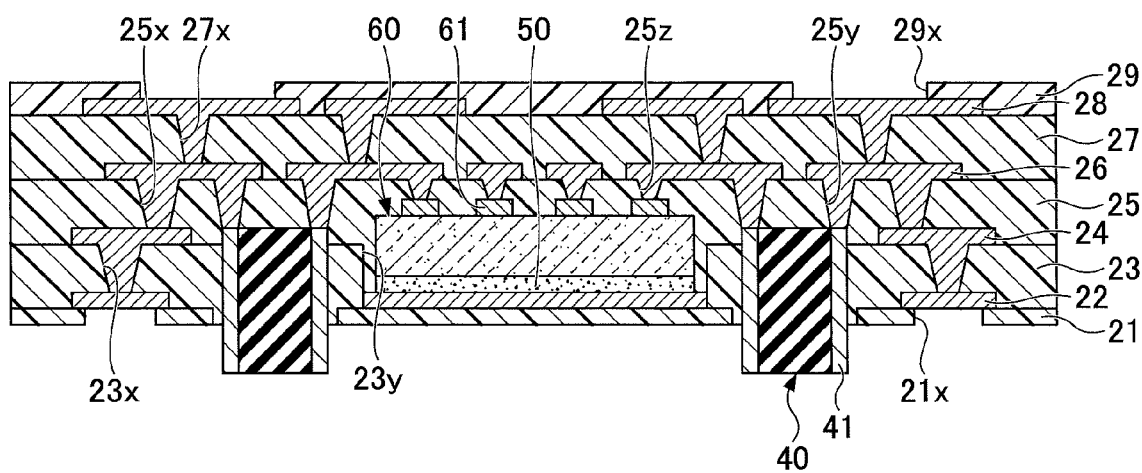
FIG. 1 is a cross-sectional view of a semiconductor device of a first embodiment.

The structure of the semiconductor device of the first embodiment is described. FIG. 1 is a cross-sectional view of the semiconductor device of the first embodiment. Referring to FIG. 1, the semiconductor device 10 includes a first insulating layer 21, a wiring layer 22, a second insulating layer 23, a wiring layer 24, a third insulating layer 25, a wiring layer 26, a fourth insulating layer 27, a wiring layer 28, a solder resist layer 29, a passive element 40, a bonding layer 50, and a semiconductor chip 60.

In the semiconductor device 10 illustrated in FIG. 1, the side of the first insulating layer 21 is referred to as a low side (a lower surface) in FIG. 1, and the side of the solder resist layer 29 is referred to as an upper side (an upper surface).

In the semiconductor device 10, the first insulating layer 21 is formed on the lower outermost layer. The material of the first insulating layer 21 may be a thermosetting insulating resin or the like containing an epoxy resin or a phenolic resin as a major component. The thickness of the first insulating layer 21 may be, for example, about 20 μm through about 40 μm. The first insulating layer 21 may contain a filler such as silica ($SiO_2$).

The wiring layer 22 is formed on the first insulating layer 21 (on one surface of the first insulating layer 21). A part of the wiring layer 22 forms a semiconductor chip mounting portion where the semiconductor chip 60 is mounted through the bonding layer 50. The semiconductor chip mounting portion being a part of the wiring layer 22 may be electrically independent. Said differently, the semiconductor chip mounting portion may not be electrically connected with any member, wiring, or the like. The material of the wiring layer 22 is, for example, a metal containing copper (Cu) or the like. The thickness of the wiring 22 may be about 10 μm through about 40 μm. The wiring layer 22 is a typical example of a wiring layer of the first embodiment.

Parts of the wiring layer 22 are exposed inside plural opening portions, which are formed in the first insulating layer 21. The wiring layer 22 exposed inside the opening portion 21x functions as an electrode pad, which is electrically connected with another semiconductor device 70 or the like (see FIG. 5, described below). Hereinafter, the wiring layers 22 respectively exposed inside the opening portions 21x, which are formed in the first insulating layer 21, may be referred to as first electrode pads 22. The plan views of the first electrode pads 22 may be like, for example, circles having diameters of about 100 through about 200 μm. The pitch of the first electrode pads 22 may be about 200 μm through about 400 μm.

When it is preferable, a metallic layer may be formed to cover an exposed surface of the first electrode pad 22. An example of the metallic layer is an Au layer, a Ni/Au layer, which is a metallic layer formed by laminating a Ni layer and an Au layer in this order, a Ni/Pd/Au layer, which is a metallic layer formed by laminating a Ni layer, a Pd layer, and an Au layer in this order or the like. An external connection terminal such as a solder ball or the like may be formed on the first electrode pad 22.

The second insulating layer 23 is formed to cover the wiring layer 22 on the first insulating layer 21. The material of the second insulating layer 23 may be an insulating resin similar to that of the first insulating layer 21. The thickness of the second insulating layer 23 may be, for example, about 30 to about 60 μm. The second insulating layer 23 may contain a filler made of silica ($SiO_2$) or the like.

In the second insulating layer 23, a via hole 23x and a semiconductor chip accommodating portion 23y are formed. The via hole 23x is opened on toward the third insulating layer 25 and the bottom surface of the via hole 23x is formed by the upper surface of the wiring layer 22. The area of the opening portion is greater than the area of the bottom surface to thereby form a recess shaped like a truncated cone. The semiconductor chip accommodating portion 23y is a recess shaped like a rectangle. The semiconductor chip accommodating portion 23y is opened on the side of the third insulating layer 25, and has a bottom surface of a semiconductor chip mounting portion, which is a part of the wiring layer 22.

The semiconductor chip accommodating portion 23y accommodates a semiconductor chip 60, which is mainly made of silicon and has plural electrode pads 61 on a circuit forming surface, in a face-up state (i.e., the circuit forming surface is directed to a side opposite to the first insulating layer 21). The back surface of the semiconductor chip 60 (the surface on a side opposite to the circuit forming surface) is joined to the semiconductor chip mounting portion, which is a part of the wiring layer 22 exposed on a bottom portion of the semiconductor chip accommodating portion 23y through the bonding layer 50. The bonding layer 50 may be, for example, a die attach film or the like.

A predetermined clearance is formed between the side surface of the semiconductor chip 60 and the inner side surface of the semiconductor chip accommodating portion 23y. Although a part of the semiconductor chip 60 on the side of the circuit forming surface protrudes from the upper surface of the second insulating layer 23, the entire semiconductor chip 60 may be accommodated inside the semiconductor chip accommodating portion 23y. In this case, the semiconductor chip 60 protrudes from the upper surface of the second insulating layer 23.

As described above, because the semiconductor chip 60 is built in the semiconductor device 10, in comparison with a case where the semiconductor chip 60 is mounted on any surface of the semiconductor device 10, the semiconductor device 10 has a structure, which is substantially symmetrical up and down. Therefore, a deflection of the semiconductor device 10 can be reduced.

More specifically, when the semiconductor chip 60 is mainly made of silicon, the coefficient of thermal expansion is about 3.4 ppm/°C., and the Young's modulus is about 200 GPa. On the other hand, when the first insulating layer 21 and the other insulating layers are mainly made of an epoxy resin, the coefficient of thermal expansion is about 8 to about 150 ppm/°C., and the Young's modulus is about 0.03 GPa to about 13 GPa.

If the semiconductor chip 60 has a low coefficient of thermal expansion and a high Young's modulus and the semiconductor chip 60 is mounted on any one of the surfaces of the semiconductor device 10, the surface, on which the semiconductor chip 60 is mounted, is hardly deformed by thermal stress or the like, and the surfaces, on which the semiconductor chip 60 is not mounted, are easily deformed by the thermal stress or the like. Therefore, the semiconductor chip 10 is deflected.

On the other hand, within the first embodiment, the semiconductor device 10 is structured so that the semiconductor chip 60 having a low coefficient of thermal expansion and a high Young's modulus is arranged in the vicinity of a middle portion in the thickness direction of the semiconductor chip 60. Therefore, solid state properties (e.g., a coefficient of thermal expansion and a Young's modulus) are balanced in the up and down directions. With this, it is possible to reduce the deflection of the semiconductor device 10 in comparison with a case where the semiconductor chip 60 is mounted on any one of the surfaces of the semiconductor device 10.

On the semiconductor device 10, two passive elements 40 each including an electrode 41 are mounted. The passive elements 40 are, for example, a capacitor or the like. Specifically, the passive element 40 is, for example, a capacitor for decoupling provided to stabilize electric power of the semiconductor chip 60. For example, one of the electrodes 41 is connected with the power source and the other one of the electrodes 41 is connected with a reference potential (GND).

The passive element 40 includes an embedded portion, which is embedded in a first insulating layer 21, a second insulating layer 23, and a third insulating layer 25, and a protruding portion, which protrudes from the lower surface (the other surface) of the first insulating layer 21. Said differently, the passive element 40 penetrates through the first insulating layer 21 and the second insulating layer 23, and the upper surface (the end surface) of the passive element 40 is positioned inside the third insulating layer 25. The lower surface of the passive element 40 protrudes from the lower surface of the first insulating layer 21 (the other surface). The upper surface of the passive element 40 and the upper surface of the second insulating layer 23 may be on the same plane.

The protruding amount of the protruding portion of the passive element 40 can be determined as follows. The protruding amount is a distance between the lower surface of the passive element 40 and the lower surface (the other surface) of the first insulating layer 21. Said differently, a semiconductor device of a POP structure may be formed by laminating another semiconductor device on a side of the first electrode pad 22 of the semiconductor device 10 (see, FIG. 5 described below). At this time, a solder ball having a predetermined diameter or the like is mounted on the first electrode pad 22. Thus, a gap between the lower surface (the other surface) of the first insulating layer 21 of the semiconductor device 10 and the surface of the other semiconductor device facing the lower surface of the first insulating layer 21 is determined by a diameter of the solder ball mounted on the first electrode pad 22.

Because the diameter of an ordinarily used solder ball is about 200 µm to about 600 µm, a gap between the lower surface (the other surface) of the first insulating layer 21 of the semiconductor device 10 and the facing surface of the other semiconductor device is about 150 µm to about 500 µm. Therefore, the protruding amount of the protruding portion of the passive element 40 is set to be less than the gap between the lower surface (the other surface) of the first insulating layer 21 of the semiconductor device 10 and the facing surface of the other semiconductor device. With this, the gap between the lower surface (the other surface) of the first insulating layer 21 of the semiconductor device 10 and the facing surface of the other semiconductor device can be effectively used.

In order to build the passive element 40 completely in the semiconductor device 10, the insulating layer 21 is preferably thickened depending on the thickness of the passive element 40. The semiconductor device 10 is thickened by just that much. However, in the semiconductor device 10 of the embodiment, a part of the passive element 40 is exposed as the protruding portion. Since the thickness of the insulating layer 21 is prevented from increasing, the semiconductor device 10 can be thinned.

The wiring layer 24 is formed on the second insulating layer 23. The wiring layer 24 includes a via wiring, which penetrates through the second insulating layer 23 and fills the inside of the second via holes 23x, from which the upper surface of the wiring layer 22 is exposed, and a wiring pattern formed on the upper surface of the second insulating layer 23. The wiring layer 24 is electrically connected with the wiring layer exposed inside the via hole 23x.

Said differently, a via wiring (a via wiring filling the inside of the via hole 23x) forming the wiring layer 24 is electrically connected with the first electrode pad 22. For example, the material and thickness of the wiring layer 24 are similar to those of the wiring layer 22. Via wirings filling the insides of the plural via holes 23x are typical examples of plural second via wirings of the first embodiment.

The third insulating layer 25 is formed so as to coat the second insulating layer 23, the wiring layer 24, a portion of the passive element 40 exposed on the second insulating layer 23, and the circuit forming surface and the side surface of the semiconductor chip 60. The material of the third insulating layer 25 is similar to that of the first insulating layer 21 such as an insulating resin. The thickness of the third insulating layer 25 may be, for example, about 30 µm through about 60 µm. The third insulating layer 25 may contain a filler made of silica ($SiO_2$) or the like.

The wiring layer 26 is formed on the third insulating layer 25. The wiring layer 26 includes a via wiring filling the inside of a via hole 25x, a via wiring filling the inside of a via hole 25y, a via wiring filling the inside of a via hole 25z, and a wiring pattern formed on the upper surface of the third insulating layer 25.

The via hole 25x penetrates through the third insulating layer 25. The wiring layer 24 is exposed on the via hole 25x. The via hole 25y penetrates through the third insulating layer 25. The electrode 41 of the wiring layer 40 is exposed on the via hole 25y. The via hole 25z penetrates through the third insulating layer 25. The electrode pad 61 of the semiconductor chip 60 is exposed on the via hole 25z.

The wiring layer 26 includes a portion electrically connected with the wiring layer 24 exposed inside the via hole 25x. Further, the wiring layer 26 includes a portion electrically connected with the electrode 41 of the passive element 40 exposed inside the via hole 25y and a portion electrically connected with the electrode pad 61 of the semiconductor chip 60, which is exposed inside the via hole 25z. For example, the material and the thickness of the wiring layer 26 may be similar to those of the wiring layer 22.

The passive element 40 and the semiconductor chip 60 are electrically connected through a via wiring filling the inside of the via holes 25y, the wiring pattern formed on the third insulating layer 25, and the via wiring filling the inside of the via hole 25z, which form the wiring layer 26.

Said differently, the via wirings (the via wiring filling the inside of the via hole 25y and the via wiring filling the inside of the via hole 25z), which are arranged in the third insulating layer 25, forms an electrical connecting path between the passive element 40 and the semiconductor chip 60. The via wiring (the via wiring filling the inside of the via hole 25y and the via wiring filling the inside of the via hole 25z) is a typical example of the first via wiring of the first embodiment.

The passive element 40 is electrically connected with a via wiring filling the inside of the via hole 25y, the wiring pattern formed on the third insulating layer 25, and the via wiring filling the inside of the via hole 25x, which form the wiring layer 26. Further, the via wiring filling the inside of the via hole 25x is electrically connected with the first electrode pad 22 via the wiring pattern, which is formed on the second insulating layer 23 and forms the wiring layer 24, and the via wiring filling the inside of the via hole 23x.

Said differently, the passive element 40 is electrically connected with the first electrode pad 22. The via wiring, which fills the inside of the via hole 23x and is arranged on the second insulating layer 23, forms a part of a passage electrically connecting the passive element 40 to the first electrode pad 22.

Although it is not illustrated, the semiconductor chip 60 is electrically connected with the via wiring filling the inside of the via hole 25z, the wiring pattern formed on the third insulating layer 25, and the via wiring filling the inside of the via hole 25x, which form the wiring layer 26. Further, the via wiring filling the inside of the via hole 25x is electrically connected with the first electrode pad 22 via the wiring pattern formed on the second insulating layer 23 and the via wiring filling the inside of the via hole 23x, which form the wiring layer.

Said differently, the semiconductor chip 60 is electrically connected to the first electrode pad 22. The via wiring, which fills the inside of the via hole 23x and arranged on the second insulating layer 23, forms a part of a passage electrically connecting the semiconductor chip 60 with the first electrode pad 22.

The fourth insulating layer 27 is formed to cover the wiring layer 26 on the third insulating layer 25. The material of the fourth insulating layer 27 is similar to that of the first insulating layer 21 such as an insulating resin. The thickness of the fourth insulating layer 27 may be, for example, about 30 through about 60 μm. The fourth insulating layer 27 may contain a filler made of silica ($SiO_2$) or the like.

The wiring layer 28 is formed on the fourth insulating layer 27. The wiring layer 28 includes a via wiring, which penetrates through the fourth insulating layer 27 and fills the inside of the via hole 27x, inside which the upper surface of the wiring layer 26 is exposed, and a wiring pattern formed on the upper surface of the fourth insulating layer 27. The wiring layer 28 is electrically connected with the wiring layer 26 exposed inside the via hole 27x. For example, the material and the thickness of the wiring layer 28 may be similar to those of the wiring layer 22.

The solder resist layer 29 is formed to cover the wiring layer 28 on the fourth insulating layer 27. The thickness of the solder resist layer 29 may be, for example, about 30 μm to about 60 μm. The solder resist layer 29 may contain a filler made of silica ($SiO_2$) or the like. The solder resist layer 29 includes an opening portion 29x, and a part of the wiring layer 28 is exposed inside the opening portion 29x.

The wiring layer exposed inside the opening portion 29x functions as an electrode pad, which is electrically connected to another semiconductor device, a semiconductor chip, a mounting board, or an electrode pad electrically connected to an electronic part (not illustrated) or the like. Hereinafter, the wiring layer 28 exposed inside the opening portion 29x may be referred to as a second electrode pad 28. The plan views of the second electrode pads 28 may be like a circle having a diameter of about 100 μm through about 350 μm. For example, the pitch of the second electrode pad 28 may be about 400 μm through about 500 μm.

When it is preferable, a metallic layer may be formed to cover an exposed surface of the second electrode pad 28. An example of the metallic layer is an Au layer, a Ni/Au layer, which is a metallic layer formed by laminating a Ni layer and an Au layer in this order, of a Ni/Pd/Au layer, which is a metallic layer formed by laminating a Ni layer, a Pd layer, and an Au layer in this order or the like. An external connection terminal such as a solder ball, a lead pin, or the like may be formed on the second electrode pad 28.

As described, the semiconductor chip 60 being an active element is built in the semiconductor device 10. Further, the passive element 40 is mounted so that a part of the passive element 40 protrudes from the lower surface (the other surface) of the first insulating layer 21. However, the semiconductor device 10 may have mounted multiple types of the passive elements including the passive element 40. It is not limited to that all passive elements protrude from the lower surface (the other surface) of the first insulating layer. Said differently, the semiconductor device 10 may include a passive element completely embedded in the first insulating layer 21 or the like.

Further, the semiconductor device 10 may be mounted on the lower surface (the other surface) of the first insulating layer 21 without embedding a passive element, which has a height (a thickness) low enough not to prevent miniaturization and a thin profile of the semiconductor device having the POP structure, in the first insulating layer 21 or the like.

An example of the passive element, on which the semiconductor device 10 can be mounted, is a capacitor, an inductor, a resistance, a thermistor, a crystal oscillator, or the like. The passive element is not limited to a type having two electrodes.

[A Manufacturing Method of a Semiconductor Device of the First Embodiment]

Figure 2:
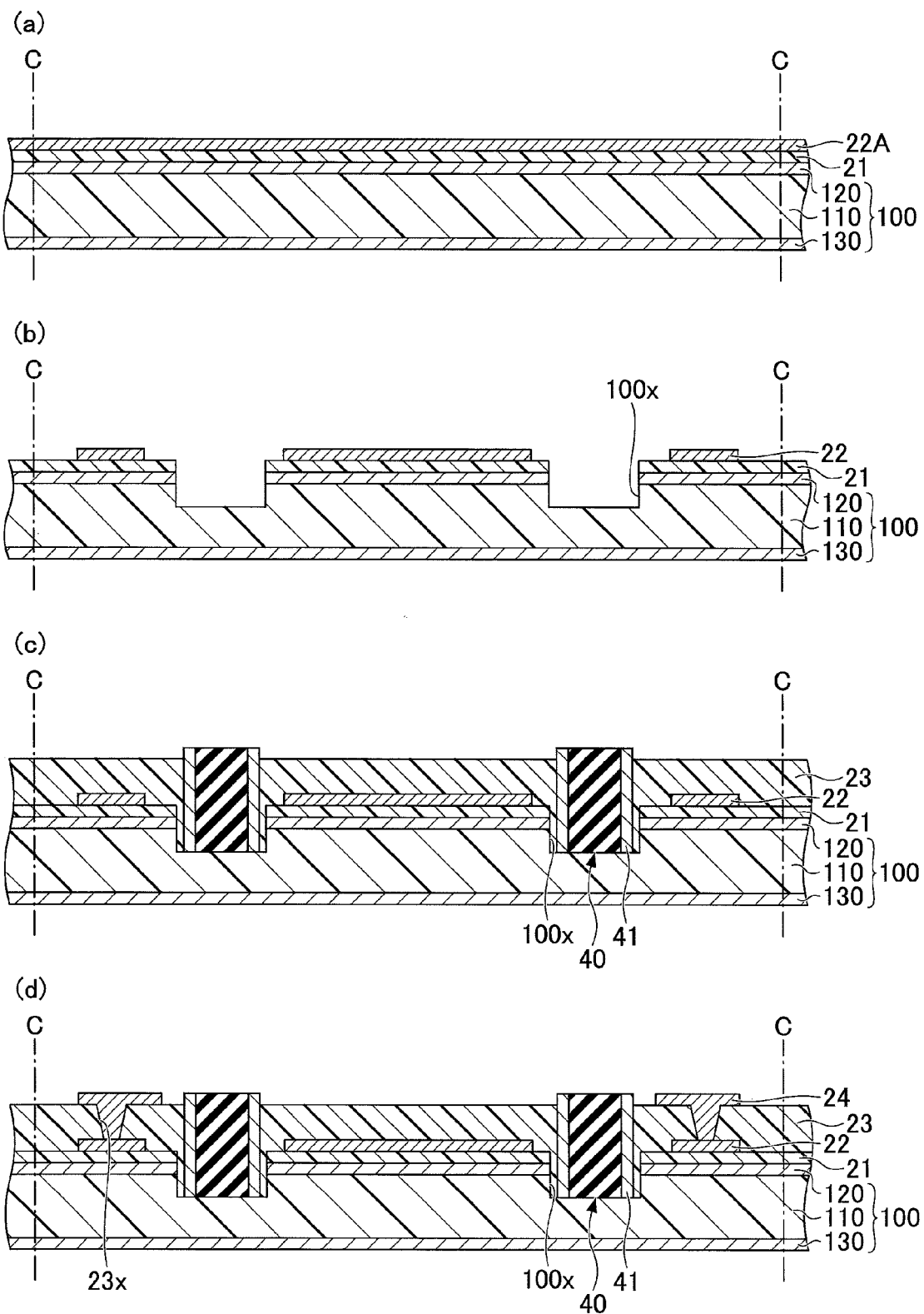
FIG. 2 illustrates a process of manufacturing the semiconductor device of the first embodiment.
Figure 3:
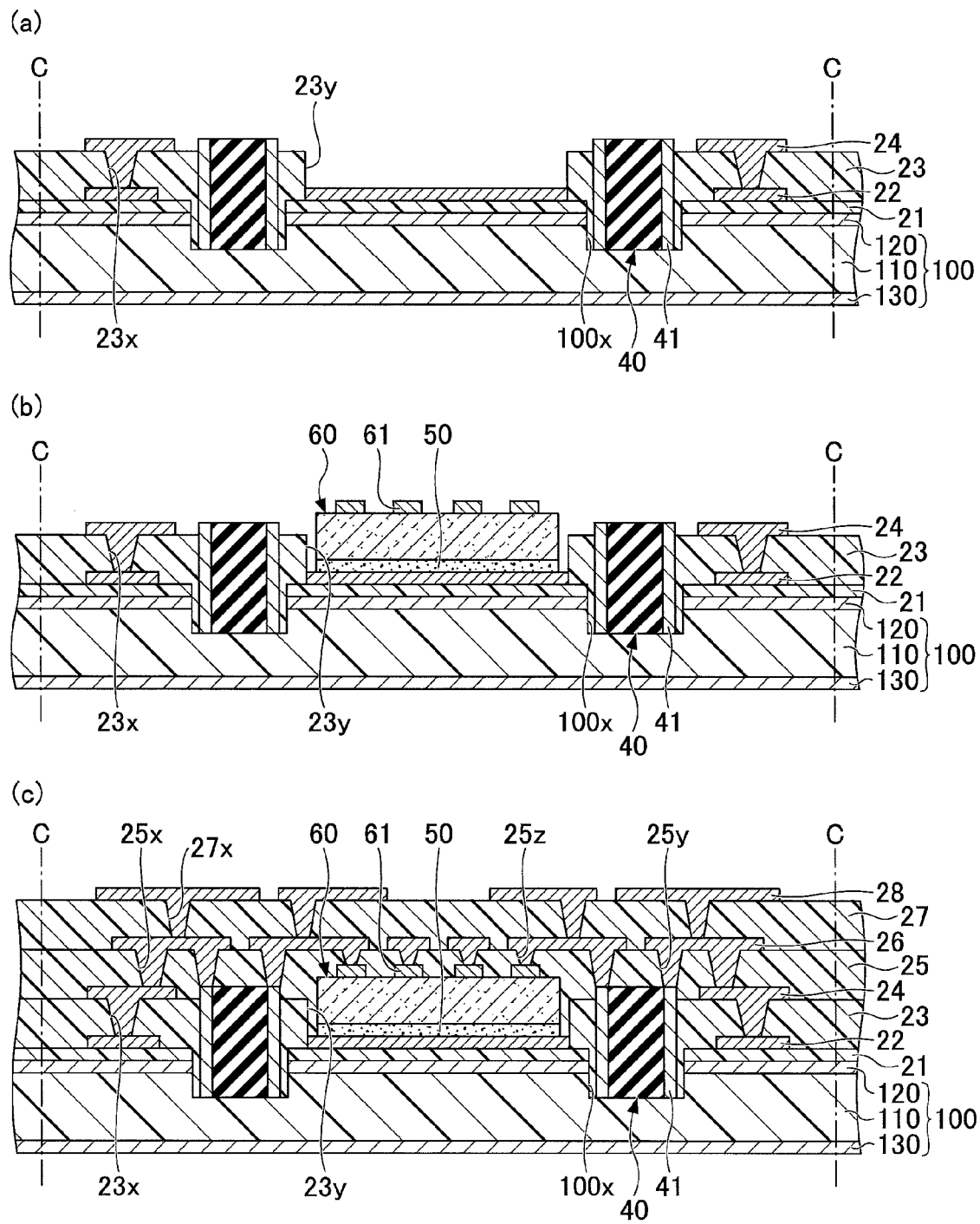
FIG. 3 illustrates the process of manufacturing the semiconductor device of the first embodiment.
Figure 4:
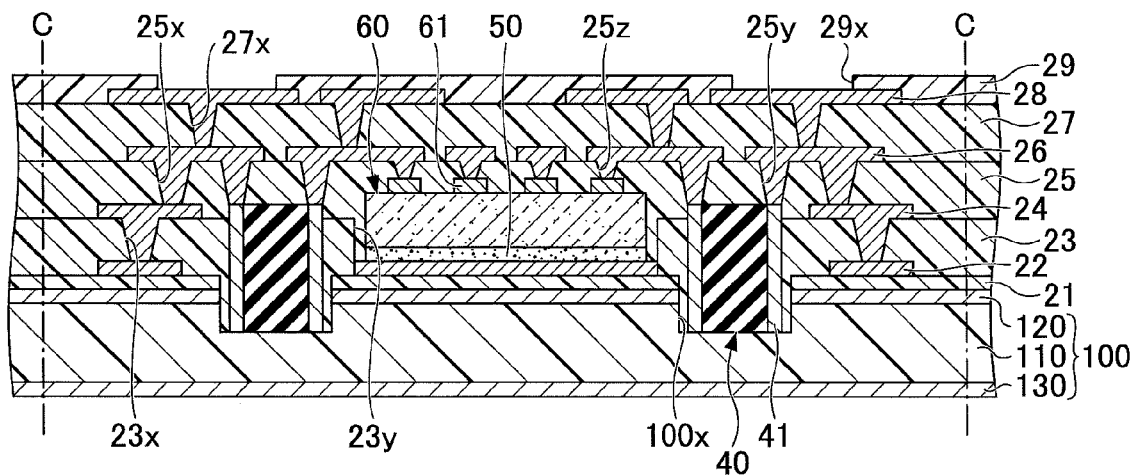
FIG. 4 illustrates the process of manufacturing the semiconductor device of the first embodiment.
Figure 4:
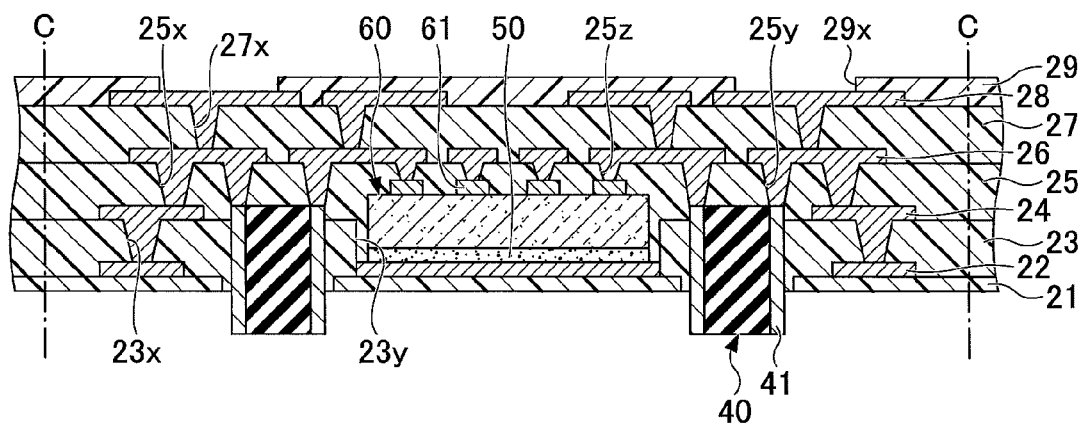
Figure 4:
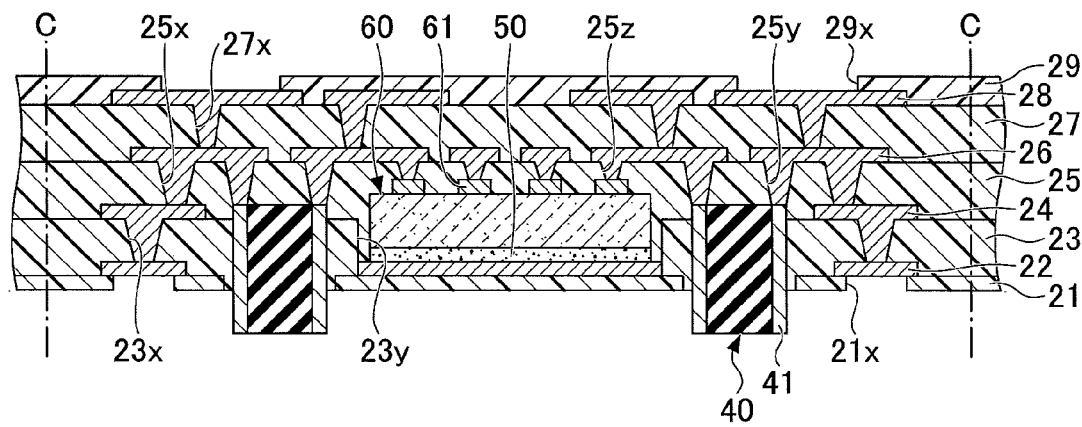

Next, the manufacturing method of the semiconductor device 10 of the first embodiment is described. FIG. 2 through FIG. 4 illustrate manufacturing processes of the semiconductor device of the first embodiment. Referring to FIGS. 2 to 4, lines C (hereinafter, a "cutting position C") indicate positions where a structure is finally cut by a dicer or the like.

In the following processes, a structure having plural regions to be semiconductor devices 10 is manufactured. The structure is cut at the cutting positions C to obtain plural semiconductor devices 10. However, a single semiconductor device 10 may be manufactured on a supporting member 100, described later.

Referring to (a) of FIG. 2, the supporting member 100 is prepared. The supporting member 100 is formed by providing metallic foils 120 and 130 on respective surfaces of the insulating layer 110. A first insulating layer 21 and a metallic foil 22A are sequentially laminated on the metallic foil 120. The supporting member 100 is, for example, a so-called glass epoxy substrate or the like. The glass epoxy substrate is formed by laminating copper foils as the metallic foils 120 and 130 on the both surfaces of the insulating layer 110, which is formed by impregnating an epoxy resin into a glass cloth.

The material of the first insulating layer 21 may be a thermosetting insulating resin or the like containing an epoxy resin or a phenolic resin as a major component. The thickness of the first insulating layer 21 may be, for example, about 20 μm through about 40 μm. The first insulating layer 21 may contain a filler such as silica ($SiO_2$).

The metallic foil 22A is, for example, a copper foil. The thickness of the metallic foil 22A may be, for example, about 10 μm to about 40 μm. The metallic foil 22A becomes the wiring layer 22 after being patterned in a latter process.

Referring to (b) of FIG. 2, the metallic foil 22A is patterned to form the wiring layer 22 including portions to be the semiconductor chip mounting portion and the first electrode pad. In an area where the wiring layer 22 is not formed, a recess 100x is formed. The recess 100x penetrates through the first insulating layer 21 and the metallic foil 120. The bottom portion of the recess 100x reaches an inside of the insulating layer 110. For example, the wiring layer 22 can be formed by providing a resist layer (not illustrated) for selectively coating the upper surface of the metallic foil 22A. Thereafter, a part of the metallic foil 22A, which is not coated by the resist layer (not illustrated), is removed by etching.

The recess 100x can be formed by processing with a grinder such as Leutor or the like. The passive element 40 is inserted into the recess 100x in a latter process. Therefore, the recess 100x is formed to have a size slightly greater than that of the passive element 40. For example, the recess 100x can be formed to have a size causing a clearance of several tens to be formed around the passive element 40 when the passive element 40 is inserted into the recess 100x.

Next, referring to (c) of FIG. 2, the passive element 40 having two electrodes 41 is inserted into the recess 100x. The passive element 40 can be inserted into the recess 100x so that the upper surface of the passive element 40 protrudes from the recess 100x. An adhesion bond may be provided on an inner bottom surface or an inner side surface of the recess 100x before inserting the passive element 40.

Subsequently, an insulating resin is laminated on the first insulating layer 21 (one of the surfaces of the first insulating layer 21) so as to coat at least part of the passive element 40 and the wiring layer 22 to thereby form the second insulating layer 23. At this time, the second insulating layer 23 can be formed so that the upper surface of the passive element 40 protrudes from the upper surface of the second insulating layer 23. At this time, the second insulating layer 23 can be formed so that the upper surface of the passive element 40 and the upper surface of the second insulating layer 23 are on the same plane. At this time, the second insulating layer 23 can be formed so that the upper surface of the passive element 40 is coated by the second insulating layer 23.

Further, the second insulating layer 23 fills inside the recess 100x. For example, inner side surfaces of the first insulating layer 21 in the recess 100x, into which the passive element 40 is inserted, are coated by the second insulating layer 23.

The material of the second insulating layer 23 may be an insulating resin similar to that of the first insulating layer 21. The thickness of the second insulating layer 23 may be, for example, about 30 μm to about 60 μm. The second insulating layer 23 may contain a filler made of silica ($SiO_2$) or the like.

Referring to (d) of FIG. 2, a via hole 23x, which penetrates the second insulating layer 23 to cause the upper surface of the wiring layer 22 to be exposed on the second insulating layer 23, is formed in the second insulating layer 23. The via hole 23x may be formed by a laser processing method using, for example, $CO_2$ laser or the like. The via hole 23x is opened on the side of the third insulating layer 25 and the bottom surface of the via hole 23x is formed by the upper surface of the wiring layer 22. The area of the opening portion is greater than the area of the bottom surface to thereby form a recess shaped like a truncated cone.

Subsequently, the wiring layer 24 is formed on the second insulating layer 23. The wiring layer 24 includes the via wiring filling the inside of the via hole 23x and the wiring pattern formed on the upper surface of the second insulating layer 23. The wiring layer 24 is electrically connected to the wiring layer 22 exposed inside the via hole 23x. For example, the material and the thickness of the wiring layer 24 may be similar to those of the wiring layer 22. The wiring layer 24 may be formed by various wiring forming methods such as a semi-additive method and a subtractive method.

Referring to (a) of FIG. 3, the semiconductor chip accommodating portion 23y is formed in the second insulating layer 23. In order to form the semiconductor chip accommodating portion 23y, a resist layer (not illustrated) coating other than a portion (a portion overlapping a semiconductor chip mounting portion of the wiring layer 22 in a plan view) where the semiconductor chip accommodating portion 23y is formed is provided on, for example, the second insulating layer 23. Then, the second insulating layer 23 exposed on the resist layer, i.e., the second insulating layer on the semiconductor chip mounting portion, may be removed by etching. An example of etching is blasting using an abrading agent such as alumina abrasive grains.

Since the semiconductor chip mounting portion of the wiring layer 22 is formed on a portion to be the semiconductor chip accommodating portion 23y, the semiconductor chip mounting portion of the wiring layer 22 functions as an etching stopper. Therefore, only the second insulating layer 23 on the semiconductor chip mounting portion of the wiring layer 22 is removed. Therefore, the semiconductor chip accommodating portion 23y becomes a recess shaped like a rectangle. The semiconductor chip accommodating portion 23y is opened toward the third insulating layer 25, and has a bottom surface of a semiconductor chip mounting portion of the wiring layer 22.

The semiconductor chip accommodating portion 23y is the recess, in which the semiconductor chip 60 is accommodated in the later process. Therefore, the semiconductor chip accommodating portion 23y is formed to be slightly greater than the semiconductor chip 60. The semiconductor chip accommodating portion 23y can be formed to have a size causing a clearance of about several tens μm around the semiconductor chip when the semiconductor chip 60 is accommodated in the semiconductor chip accommodating portion 23y.

After the process illustrated in (a) of FIG. 3, the structure (the wiring substrate on which the passive element is mounted) illustrated in (a) of FIG. 3 may undergo electrical testing or the like. With this, a defective wiring substrate can be removed. Thus, it is possible to reduce a probability that a defective semiconductor device, on which the defective semiconductor chip is mounted in the latter process, is manufactured.

Referring to (b) of FIG. 3, the semiconductor chip 60 having plural electrode pads 61 on the circuit forming surface is accommodated in a face-up state (the circuit forming surface is directed in the direction opposite to the insulating layer 21). For example, by previously forming a bonding layer 50 using a die attach film or the like on the back surface of the semiconductor chip 60, the semiconductor chip 60 can be fixed inside the semiconductor chip accommodating portion via the bonding layer 50.

A predetermined clearance is formed between the side surface of the semiconductor chip 60 and the inner side surface of the semiconductor chip accommodating portion 23y. Although a part of the semiconductor chip 60 on the side of the circuit forming surface protrudes from the upper surface of the second insulating layer 23 in (b) of FIG. 3, the entire semiconductor chip 60 may be accommodated inside the semiconductor chip accommodating portion 23y. In this case, the entire semiconductor chip 60 does not protrude from the upper surface of the second insulating layer 23.

Next, in the process illustrated in (c) of FIG. 3, the processes illustrated in (c) and (d) of FIG. 2 are repeated to thereby sequentially laminate the wiring layer 24, the third insulating layer 25, the wiring layer 26, the fourth insulating layer 27, and the wiring layer 28 on the second insulating layer 23.

Said differently, the third insulating layer 25 is formed on the second insulating layer 23. The third insulating layer 25 coats the upper surface of the wiring layer 24, the upper surface of the passive element 40, and the circuit forming surface and the side surface of the semiconductor chip 60. There are formed the via hole 25x penetrating through the third insulating layer 25 to expose the upper surface of the wiring layer 24 on the third insulating layer 25, the via hole 25y penetrating through the third insulating layer 25 to expose the upper surface of the electrode 41 of the passive element 40 on the third insulating layer 25, and the via hole 25z penetrating through the third insulating layer 25 to expose the electrode pad 61 of the semiconductor chip 60 on the third insulating layer 25. The material of the third insulating layer 25 is similar to that of the first insulating layer 21 such as an insulating resin. The thickness of the third insulating layer 25 may be, for example, about 30 μm through about 60 μm. The third insulating layer 25 may contain a filler made of silica ($SiO_2$) or the like.

Subsequently, the wiring layer 26 is formed on the second insulating layer 25. The wiring layer 26 includes the via wiring filling the inside of the via hole 25x, the via wiring filling the inside of the via hole 25y, the via wiring filling the inside of the via hole 25z, and the wiring pattern formed on the upper surface of the third insulating layer 25.

The wiring layer 26 includes a portion electrically connected to the wiring layer 24 exposed inside the via hole 25x. Further, the wiring layer 26 includes the portion electrically connected to the electrode 41 of the passive element 40 exposed inside the via hole 25y and a portion electrically connected to the electrode pad 61 of the semiconductor chip 60, which is exposed inside the via hole 25z. For example, the material and the thickness of the wiring layer 26 may be similar to those of the wiring layer 22.

Further, after forming the fourth insulating layer 27 coating the wiring layer 26 on the third insulating layer 25, a via hole 27x is formed penetrating through the fourth insulating layer 27 to expose the upper surface of the wiring layer 26 on the fourth insulating layer 27. The material of the fourth insulating layer 27 is similar to that of the first insulating layer 21 such as an insulating resin. The thickness of the fourth insulating layer 27 may be, for example, about 30 μm through about 60 μm. The fourth insulating layer 27 may contain a filler made of silica ($SiO_2$) or the like.

Further, a wiring layer 28 connected to the wiring layer through the via hole 27x is formed on the fourth insulating layer 27. The wiring layer 28 includes the via wiring filling the inside of the via hole 27x and the wiring pattern formed on the upper surface of the fourth insulating layer 27. The wiring layer 28 is electrically connected to the wiring layer 26 exposed inside the via hole 27x. For example, the material and the thickness of the wiring layer 28 may be similar to those of the wiring layer 22.

As such, a predetermined buildup wiring layer is formed on the supporting member 100. With the first embodiment, the four-layered buildup wiring layers (the wiring layer 22, the wiring layer 24, the wiring layer 26, and the wiring layer 28) are formed. However, an n-layered buildup wiring layers (n is an integer of 1 or more) may be formed instead.

In the process illustrated in (a) of FIG. 4, a solder resist layer 29 having the opening portion 29x, from which a part of the wiring layer 28 is exposed is formed on the fourth insulating layer 27. The solder resist layer 29 may be formed by coating a liquid-like or paste-like thermosetting insulating resin of an epoxy type or an acrylic type on the fourth insulating layer 27 so as to coat the wiring layer 28 with a screen printing method, a roll coating method, a spin coat method or the like. For example, a film-like thermoset insulating resin of an epoxy type or an acrylic type or the like may be formed by laminating on the fourth insulating layer 27 to coat the fourth wiring layer 28.

The opening portion 29x can be formed by exposing the insulating resin, which is coated or laminated, to light and developing the insulating resin (photolithography). The film-like insulating resin, in which the opening portion 29x is previously formed, may be laminated on the fourth insulating layer 27 so as to coat the wiring layer 28. The material of the solder resist layer 29 may be a nonphotosensitive insulating resin. In this case, the solder resist layer 29 is formed on the fourth insulating layer 27 and cured. Thereafter, the opening portion 29x may be formed by a laser processing method using $CO_2$ laser, and a blasting process using an abrading agent such as alumina abrasive grains.

When necessary, a metallic layer or the like may be formed on the wiring layer 28 (the second electrode pad 28), which is exposed inside the opening portion 29x, by electroless plating. An example of the metallic layer is an Au layer, a Ni/Au layer, which is a metallic layer formed by laminating a Ni layer and an Au layer in this order, a Ni/Pd/Au layer, which is a metallic layer formed by laminating a Ni layer, a Pd layer, and an Au layer in this order or the like.

The supporting body 100 illustrated in (a) of FIG. 4 is removed in the process illustrated in (b) of FIG. 4. In order to remove the supporting member 100, the metallic foil 130 is removed. When the metallic foil 130 is a copper foil, the metallic foil can be removed by wet etching using, for example, aqueous ferric chloride, aqueous copper chloride, aqueous ammonium persulfate, aqueous copper ammonium chloride, a hydrogen peroxide solution, and an etching solution of sulfuric acid system. When the second electrode pad 28 is made of copper, it is necessary to mask the second electrode pad 28.

Subsequently, the insulating layer 110 is removed. For example, the insulating layer 110 can be removed by a blasting process using the abrading agents such as the alumina abrasive grains. Because the metallic foil 120 functions as an etching stopper, only the insulating layer 110 is removed while maintaining the metallic foil 120. Thereafter, the metallic foil 120 is removed. In a case where the metallic foil 120 is a copper foil, the copper foil can be removed by a method similar to the removal of the metallic foil 130. With this, the lower surface (the other surface) of the first insulating layer 21 is exposed downward. The part of the passive element 40 protrudes from the lower surface (the other surface) of the first insulating layer 21.

At this time, a part of the second insulating layer 23 attached to the side surfaces 41 of the passive element 40 is removed.

Next, in the process illustrated in (c) of FIG. 4, the opening portion 21x penetrating through the first insulating layer 21 is formed in the first insulating layer 21. Thus, part of the wiring layer 22 is exposed inside the opening portion 21x. Then, the first electrode pad 22 is formed. The opening portion 21x may be formed by a laser processing method using, for example, $CO_2$ laser or the like.

When it is preferable, a metallic layer may be formed on the wiring layer 22 (the first electrode pad 22), which is exposed inside the opening portion 21x, by, for example, electroless plating or the like. An example of the metallic layer is an Au layer, a Ni/Au layer, which is a metallic layer formed by laminating a Ni layer and an Au layer in this order, a Ni/Pd/Au layer, which is a metallic layer formed by laminating a Ni layer, a Pd layer, and an Au layer in this order or the like. By the above processes, the structure including plural areas (each area surrounded by the cutting positions) to be the semiconductor devices 10 can be manufactured.

After the process illustrated in (c) of FIG. 4, the structure including plural areas (each area surrounded by the cutting positions) is diced so as to be cut at the cutting positions C. Thus, the plural semiconductor devices 10 illustrated in FIG. 1 are completed.

[An Exemplary Application of the Semiconductor Device of the First Embodiment]

Figure 5:
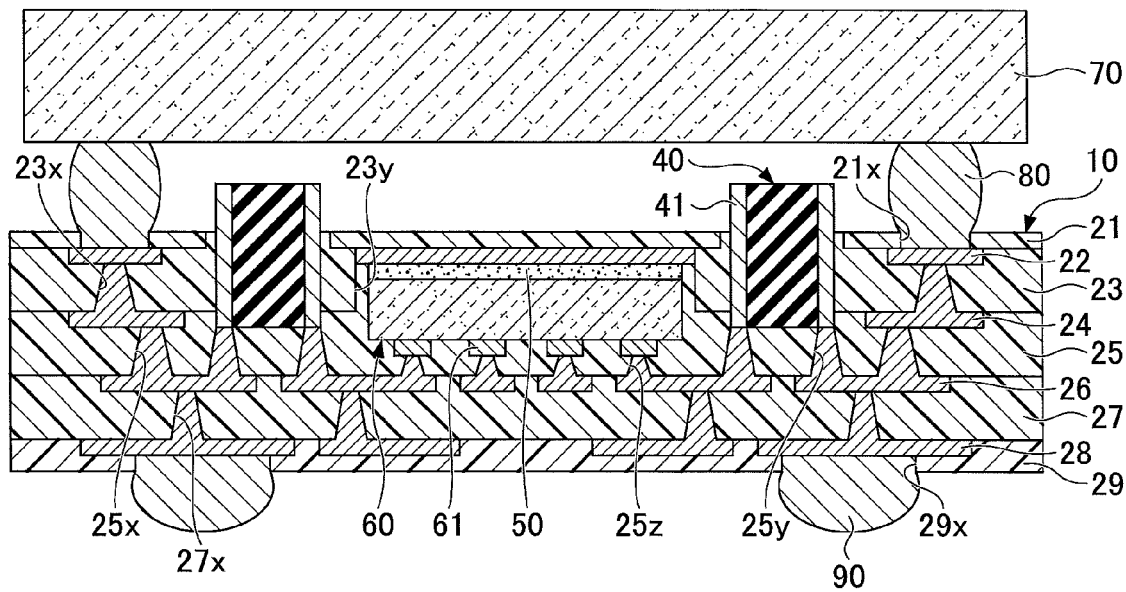
FIG. 5 is a cross-sectional view of an exemplary semiconductor device having a POP structure.

Next, the manufacturing method of the semiconductor device 10 of the first embodiment is described. FIG. 5 is a cross-sectional view of an exemplary semiconductor device having a POP structure. Referring to FIG. 5, the semiconductor device 10A is the semiconductor device of the POP structure, in which the other semiconductor device is mounted on the semiconductor device 10. Referring to FIG. 5, the semiconductor device 10 is illustrated upside down in comparison with the semiconductor device 10 illustrated in FIG. 1.

The electrode pad (not illustrated) of the semiconductor device 70 is electrically connected to the first electrode pad 22 of the semiconductor device 10 via a joining portion 80. The joining portion 80 is, for example, a solder ball. The material of the solder ball may be, for example, an alloy containing Pb, an alloy containing Sn and Cu, an alloy containing Sn and Ag, an alloy containing Sn, Ag, and Cu, or the like.

An external connection terminal 90 is formed on the second electrode pad 28 of the semiconductor device 10. The external connection terminal 90 is a terminal electrically connected to the other semiconductor device, a semiconductor chip, a mounting board such as a motherboard, or an electronic part (not illustrated). The external connecting terminal 90 is, for example, a solder ball or the like. The material of the solder ball may be, for example, an alloy containing Pb, an alloy containing Sn and Cu, an alloy containing Sn and Ag, an alloy containing Sn, Ag, and Cu, or the like.

As described previously, the diameter of the ordinarily used solder ball is about 200 μm to about 600 μm. Therefore, the gap between facing surfaces of the semiconductor device 10 and the semiconductor device 70 is about 150 μm to about 500 μm. Therefore, the protruding amount of the protruding portion of the passive element 40 is set to be less than a value of the gap between the facing surfaces of the semiconductor device 10 and the semiconductor device 70.

There are various heights depending on types of the passive element 40. Here, the height is a size of the passive element in the thickness direction of the semiconductor device 10. For example, the height is several hundreds μm. In a previously available semiconductor device, the passive element having such a great height is mounted on the surface of the semiconductor device. Therefore, the protruding amount reaches several hundred μm.

Therefore, in order to realize the semiconductor device having the POP structure by securing a gap between laminated semiconductor devices, it is preferable to prepare a solder ball or the like having a diameter equal to or greater than several hundred μm. Then, the total thickness of the semiconductor device having the POP structure becomes great. Further, because each electrode pad of the semiconductor devices is to be designed to be able to mount a solder ball having a diameter equal to or greater than several hundred μm, there is a problem in that the width of the semiconductor device having the POP structure is increased.

Meanwhile, as described previously, in the semiconductor device 10, the protruding amount of the passive element 40 is set to be less than a value of the gap between the facing surfaces of the semiconductor device 10 and the semiconductor device 70, which gap is determined by the diameter of the ordinarily used solder ball. With this, a problem in that the total thickness of the semiconductor device having the POP structure increases and a problem in that the width of the semiconductor device having the POP structure increases are avoidable.

Further, because the passive element 40 protrudes from the first insulating layer 21, it is avoidable to increase the number of the insulating layers or to increase the thickness of the insulating layer in order for embedding the entire passive element 40 in the insulating layers. Thus, the semiconductor device 10 itself can be thinned and miniaturized. As a result, the semiconductor device having the POP structure can be thinned and miniaturized.

Further, an end surface of the embedded portion of the passive element 40 is coated by any one of the insulating layers. The electrode 41 of the passive element 40 is electrically connected to the wiring pattern formed on one of the surfaces of the insulating layer, which coats the end surface of the embedded portion, through the via wiring, which is directly formed in the insulating layer coating the end surface of the embedded portion. Within the first embodiment, the insulating layer coating the end surface of the embedded portion is the third insulating layer 25. Further, the via wiring formed in the insulating layer, which coats the end surface of the embedded portion forms the wiring layer 26. The wiring pattern formed on one of the surfaces of the insulating layer, which coats the end surface of the embedded portion, forms the wiring layer 26.

Further, the circuit forming surface of the semiconductor chip 60 is coated by the third insulating layer 25. The electrode pad 61 of the semiconductor chip 60 is electrically connected to the wiring pattern (the wiring pattern forming the wiring layer 26) through the via wiring (the via wiring forming the wiring layer 26), which is directly formed in the third insulating layer 25.

As described, because the via wiring is directly connected to the electrode 41 of the passive element 40 and the electrode pad 61 of the semiconductor chip 60, it is possible to deal with a narrow pitch of the via wiring.

Modified Example of the First Embodiment

Within the modified example 1 of the first embodiment, passive elements having different heights are mounted in a semiconductor device. In the modified example 1 of the first embodiment, explanation of constructional elements the same as those described in the above description of the first embodiment is omitted.

Figure 6:
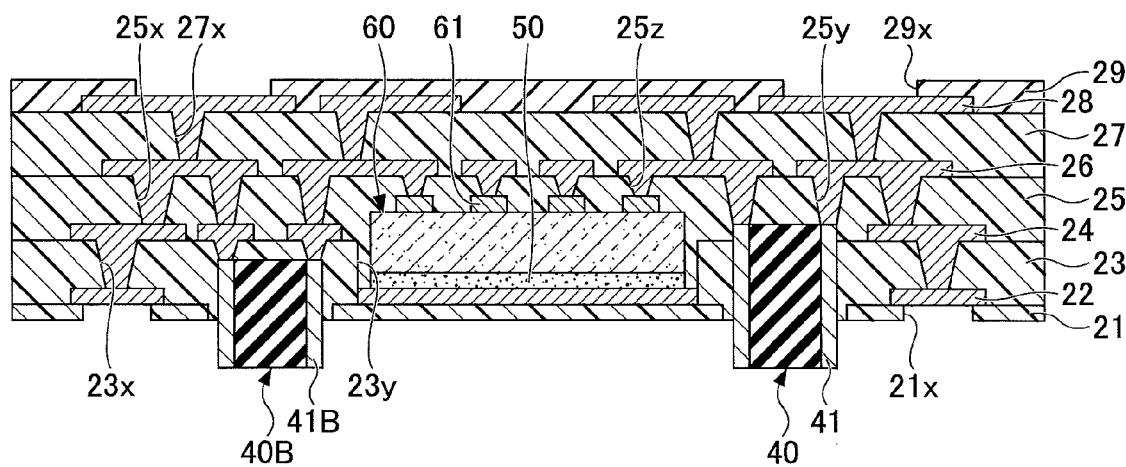
FIG. 6 is a cross-sectional view of a semiconductor device of a modified example of the first embodiment.

FIG. 6 is a cross-sectional view of the modified example 1 of the semiconductor device of the first embodiment. Referring to FIG. 6, a passive element 40B having two electrodes 41B is mounted in addition to the passive element 40 on the semiconductor device 10B. The passive element 40B is a part having a height different from the height of the passive element (the length in the thickness direction of the semiconductor device 10B).

The passive element 40B includes an embedded portion, which is embedded in the first and second insulating layers 21 and 23, and a protruding portion, which protrudes from the lower surface (the other surface) of the first insulating layer 21. Said differently, the passive element 40B penetrates through the first insulating layer 21, and the upper surface of the passive element 40B is positioned inside the second insulating layer 23.

The lower surface of the passive element 40B protrudes from the lower surface of the first insulating layer 21 (the other surface). The upper surface of the passive element 40B and the upper surface of the second insulating layer 21 may be on the same plane. Further, the protruding amount of the protruding portion of the passive element 40B (the distance between the lower surface of the passive element 40B and the lower surface of the first insulating layer 21) may be the same as the protruding amount of the protruding portion or different.

As such, passive elements having various heights can be mounted on the semiconductor device of the first embodiment. The passive element includes at least the embedded portion embedded in the first insulating layer and the protruding portion protruding from the lower surface (the other surface) of the first insulating layer. Further, the embedded amount of the passive element (the distance between the upper surface of the passive element and the lower surface (the other surface) of the first insulating layer) and the protruding amount (the distance between the lower surface of the passive element and the lower surface (the other surface) of the first insulating layer) can be appropriately selected in a range of thinning and miniaturizing the semiconductor device having the POP structure.

Various aspects of the subject-matter described herein are set out non-exhaustively in the following numbered clauses:

(1) A manufacturing method of a semiconductor device, the manufacturing method including: sequentially laminating a first insulating layer and a metallic foil, in this order, on a supporting member; forming a wiring layer by patterning the metallic foil; forming a recess, which penetrates the first insulating layer, and a bottom surface of which reaches inside the supporting member; inserting a passive element inside the recess; forming a second insulating layer, which coats at least a part of the passive element and the wiring layer, on a first surface of the first insulating layer; forming a semiconductor chip accommodating portion for accommodating a semiconductor chip in the second insulating layer; accommodating the semiconductor chip in the semiconductor chip accommodating portion while a circuit forming surface of the semiconductor chip is faced on a side opposite to the first insulating layer; forming a third insulating layer coating the circuit forming surface of the semiconductor chip on the second insulating layer; forming a wiring layer including a via wiring formed in one of the second and third insulating layers, which coats an end surface of the passive element, and wiring pattern formed on a surface of the one of the second and third insulating layers, which coats the end surface of the passive element, the surface of the one of the second and third insulating layers facing the end surface of the passive element, the wiring layer being configured to electrically connect an electrode of the passive element with the wiring pattern through the via wiring; and removing the supporting member to cause a part of the passive element to protrude from a second surface of the first insulating layer.

(2) The manufacturing method according to the above (1), wherein the forming the wiring layer by patterning the metallic foil to form the wiring layer includes a semiconductor chip mounting portion, and the forming the semiconductor chip accommodating portion removes by etching the second insulating layer on the semiconductor chip mounting portion using the semiconductor chip mounting portion as an etching stopper to thereby form the semiconductor chip accommodating portion being a recess, of which bottom surface is formed by the semiconductor chip mounting portion.

(3) The manufacturing method according to the above (2), wherein the forming the wiring layer patterns the metallic foil to form the wiring layer including the semiconductor chip mounting portion and a first electrode pad, and after removing the supporting member, an opening portion is formed in the first insulating layer to form the first electrode pad by causing a part of the wiring layer to be exposed inside the opening portion.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device comprising:
a first insulating layer being an outermost layer of the semiconductor device;
a wiring layer that is formed on a first surface of the first insulating layer and includes a first electrode pad;
a semiconductor chip having a circuit forming surface positioned on a surface of the semiconductor chip opposite to the first insulating layer;
a second insulating layer that is formed on the first surface of the first insulating layer, coats the wiring layer, and includes a semiconductor chip accommodating portion for accommodating the semiconductor chip;
a third insulating layer that is arranged on the second insulating layer and coats the circuit forming surface and side surfaces of the semiconductor chip; and
a passive element that includes an electrode and is formed of an embedded portion embedded in at least the first insulating layer and a protruding portion protruding from a second surface opposite to the first surface of the first insulating layer,
wherein an end surface of the embedded portion is coated by one of the first, second, and third insulating layers,
the electrode of the passive element is positioned at an end of the embedded portion and electrically connected to the wiring layer through a via wiring formed in at least the one of the first, second, and third insulating layers coating the end surface of the embedded portion,
the first electrode pad is electrically connected to another semiconductor device through a joining portion, and
a protruding amount of the protruding portion protruding from the second surface of the first insulating layer is less than a gap between the second surface of the first insulating layer and a surface of the another semiconductor device facing the second surface of the first insulating layer.

2. The semiconductor device according to claim 1,
wherein the embedded portion penetrates through the first and second insulating layers, and
the end surface of the embedded portion contacts the third insulating layer.

3. The semiconductor device according to claim 1,
wherein the semiconductor chip accommodating portion is a recess opened toward the third insulating layer, and
a bottom surface of the semiconductor chip accommodating portion is formed of a semiconductor chip mounting portion for mounting the semiconductor chip, the semiconductor chip mounting portion being a part of the wiring layers.

4. The semiconductor device according to claim 1,
wherein a second via wiring electrically connected to the first electrode pad is formed in the second insulating layer, and
the second via wiring includes a via wiring which is a part of a route electrically connecting the passive element to the first electrode pad.

5. The semiconductor device according to claim 4, further comprising:
a plurality of the first electrode pads; and
a plurality of the second via wirings, wherein
the second via wirings include via wiring which is a part of a route electrically connecting the semiconductor chip to at least one of the first electrode pads.

6. A semiconductor device comprising:
a first insulating layer being an outermost layer of the semiconductor device;
a semiconductor chip having a circuit forming surface positioned on a surface of the semiconductor chip opposite to the first insulating layer;
a second insulating layer that is arranged next to a first surface of the first insulating layer and includes a semiconductor chip accommodating portion for accommodating the semiconductor chip;

a third insulating layer that is arranged on the second insulating layer and coats the circuit forming surface and side surfaces of the semiconductor chip; and a passive element that includes an electrode and is formed of an embedded portion embedded in at least the first insulating layer and a protruding portion protruding from a second surface opposite to the first surface of the first insulating layer, wherein an end surface of the embedded portion is coated by one of the first, second, and third insulating layers, and the electrode of the passive element is positioned at an end of the embedded portion and electrically connected to a wiring layer, which is formed on at least one surface of the first, second, and third insulating layers through a via wiring formed in at least the one of the first, second, and third insulating layers coating the end surface of the embedded portion.

7. The semiconductor device according to claim 6,
wherein the embedded portion penetrates through the first and second insulating layers, and
the end surface of the embedded portion contacts the third insulating layer.

8. The semiconductor device according to claim 6,
wherein the wiring layer is formed on the first surface of the first insulating layer, and
the semiconductor chip accommodating portion is a recess opened toward the third insulating layer, and
a bottom surface of the semiconductor chip accommodating portion is formed of a semiconductor chip mounting portion for mounting the semiconductor chip, the semiconductor chip mounting portion being a part of the wiring layer.

9. The semiconductor device according to claim 8,
wherein the wiring layer includes a first electrode pad exposed inside an opening portion formed in the first insulating layer.

10. The semiconductor device according to claim 9,
wherein a second via wiring electrically connected to the first electrode pad is formed in the second insulating layer, and
the second via wiring includes a via wiring which is a part of a route electrically connecting the passive element to the first electrode pad.

11. The semiconductor device according to claim 9, further comprising:
a plurality of the first electrode pads; and
a plurality of the second via wirings, wherein
the second via wirings include a via wiring which is a part of a route electrically connecting the semiconductor chip to at least one of the first electrode pads.

* * * * *